(12) United States Patent
Connolly

(10) Patent No.: US 7,902,477 B1
(45) Date of Patent: Mar. 8, 2011

(54) INTEGRATED CIRCUIT TEST WORK STATION

(75) Inventor: Noel A. Connolly, Maynooth (IE)

(73) Assignee: Xilinx, Inc., San Jose, CA (US)

( * ) Notice: Subject to any disclaimer, the term of this patent is extended or adjusted under 35 U.S.C. 154(b) by 803 days.

(21) Appl. No.: 11/155,694

(22) Filed: Jun. 17, 2005

(51) Int. Cl.
*B07C 5/344* (2006.01)

(52) U.S. Cl. .......... 209/571; 209/630; 209/703; 414/935

(58) Field of Classification Search .................. 209/556, 209/567, 568, 571, 573, 630, 703, 704, 942; 414/935–941
See application file for complete search history.

(56) References Cited

U.S. PATENT DOCUMENTS

| | | | | |
|---|---|---|---|---|
| 3,094,212 A * | 6/1963 | Moore et al. | ................... | 209/548 |
| 4,926,118 A * | 5/1990 | O'Connor et al. | ............. | 324/760 |
| 5,313,156 A * | 5/1994 | Klug et al. | ................. | 324/158.1 |
| 5,931,629 A * | 8/1999 | Rodier | .......................... | 414/413 |
| 6,234,321 B1 * | 5/2001 | O'Connor et al. | ............. | 209/539 |
| 6,239,396 B1 * | 5/2001 | Kang | ............................. | 209/573 |
| 6,658,324 B2 * | 12/2003 | Bancroft et al. | .............. | 700/245 |
| 2002/0036161 A1 * | 3/2002 | Nemoto et al. | ............... | 209/573 |
| 2003/0085160 A1 * | 5/2003 | Shim et al. | .................... | 209/573 |
| 2004/0259402 A1 * | 12/2004 | Lee | ............................... | 439/173 |

* cited by examiner

*Primary Examiner* — Stefanos Karmis
*Assistant Examiner* — Kalyanavenkateshware Kumar
(74) *Attorney, Agent, or Firm* — Scott Hewett; Kevin T. Cuenot; Thomas George

(57) ABSTRACT

A test work station for testing ICs includes an output bench with sliding rails that partitions the table top of the output bench into segregated areas. ICs that pass testing are sorted according to an operating parameter, in other words binned, and placed in the appropriate segregated area. The sliding rails avoid mingling of the various categories (bins) of ICs. In a further embodiment, the test work station includes an input bench for receiving product. Failed ICs are kept on the input bench, thus segregating them from ICs that have passed testing and avoiding inadvertent mixing of bad ICs with good ICs. In a particular embodiment, the input and output benches are at a height that allows an operator to stand while working, and allows storage underneath the benches to keep the work areas clear.

17 Claims, 4 Drawing Sheets

INTEGRATED CIRCUIT TEST WORK STATION

FIELD OF THE INVENTION

This invention relates generally to techniques for testing and sorting integrated circuits ("ICs"), and more particularly to a workstation for segregating marked and unmarked ICs into bins.

BACKGROUND OF THE INVENTION

ICs are often sorted (binned) according to an operating parameter, such as operating speed. Operating parameters are generally characteristics of the IC that affect its performance in an application. Operating parameters can vary between wafer lots, between wafers in a wafer lot, or between parts (ICs) separated from a single wafer. In other words, there is a distribution of performance within a population of nominally identical parts.

After separating the ICs from a wafer, the parts are electrically tested on a test station. A typical test station runs a series of tests, first checking for gross failures, then running performance tests and infrared ("IR") scanning for mechanical defects or damage that can occur during electrical testing. After testing, parts are often binned according to their test results. Gross failures can be analyzed to determine the cause and mechanism of failure. Parts that are good may vary in desirability. For example, in a population of nominally identical ICs, some will be able to operate at a higher speed. Such devices are particularly desirable in applications where high-speed ICs are used. ICs operating at a lower speed are suitable for lower-speed applications, and are typically less expensive, which is desirable for customers who don't need the highest speed parts.

Binning the parts after testing provides high-performance parts for users needing that performance, and offers lower-cost parts for users that can accept the lower performance. Without binning, high-performance customers would have to relax their specifications or accept a lower yield, and other customers would have to pay more for performance that doesn't necessarily provide an advantage for them. Binning also allows the manufacturer to make better use of the parts distribution (i.e. higher manufacturing yields).

Some parts are packaged and marked before testing. The marking often includes an identifier that makes tracking an individual part very easy. Other parts do not have markings, and look essentially identical to each other. After testing the parts, they are conventionally loaded into chip carriers ("trays") according to their bin category at a test work station.

A conventional test work station has a bench top and shelves. The shelves contain various boxes in which the trays are placed when they are full or when binning is completed. The boxes have labels according to the bin category. However, conventional test work stations are vulnerable to mixing parts after segregation. Post-bin mixing can occur if trays of devices of a particular speed are mixed with trays of another speed, trays are placed in the wrong box, or if boxes are inadvertently mixed together.

A system for segregating ICs having different operating parameters so as to avoid post-test mixing is desirable.

SUMMARY OF THE INVENTION

A test work station for testing ICs includes an output bench with sliding rails that partitions the table top of the output bench into segregated areas. ICs that pass testing are sorted according to an operating parameter, in other words binned, and placed in the appropriate segregated area. The sliding rails avoid mingling of the various categories (bins) of ICs. In a further embodiment, the test work station includes an input bench for receiving product. Failed ICs are kept on the input bench, thus segregating them from ICs that have passed testing and avoiding inadvertent mixing of bad ICs with good ICs. In a particular embodiment, the input and output benches are at a height that allows an operator to stand while working, and allows storage underneath the benches to keep the work areas clear.

DETAILED DESCRIPTION OF THE DRAWINGS

Figure 1A:
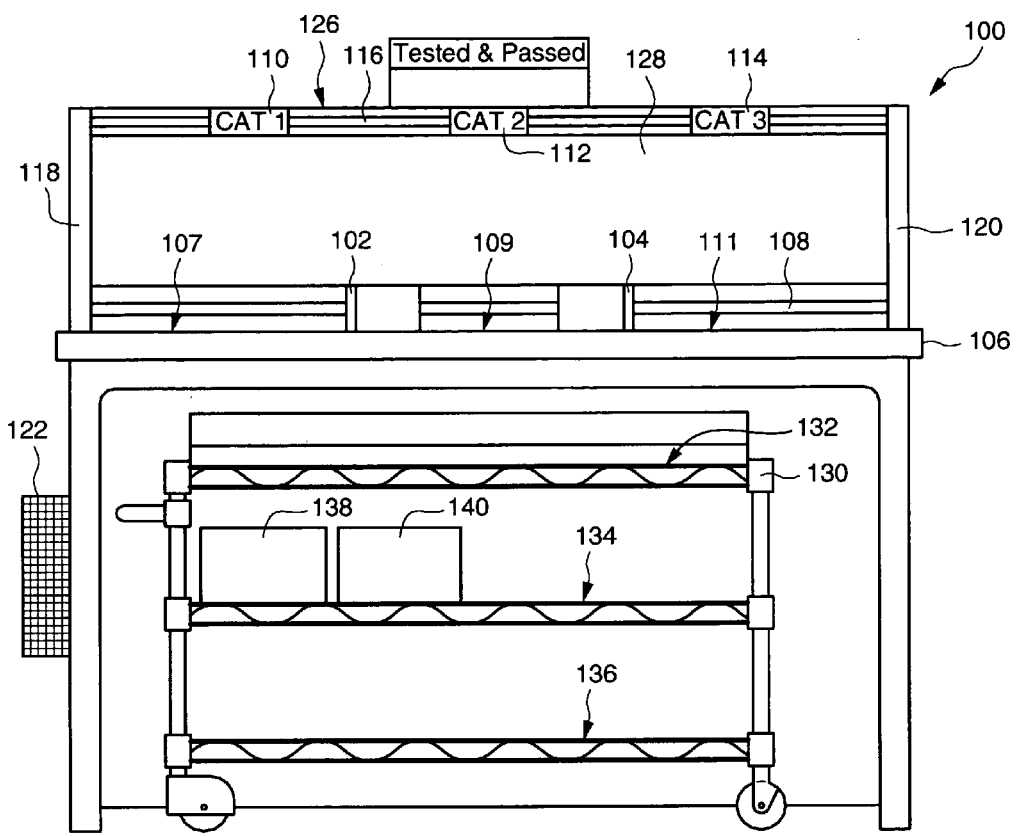
FIG. 1A is a front view of an output bench according to an embodiment of the invention.

FIG. 1A is a front view of an output bench 100 according to an embodiment of the invention. The output bench 100 is a component of an IC test work station (see FIG. 3). The output bench provides physically separate locations for each category of a binned IC. Each category (bin) of ICs is shippable. Non-shippable (i.e. failed) parts are kept on a separate bench (see FIG. 2A, ref. num. 200), avoiding co-mingling of good and bad parts.

An IC is removed from a test system (see FIG. 3, ref. num 302) and placed in its appropriate location on the output bench 100. In a particular embodiment, the ICs are finished product that is packaged in a ball-grid array ("BGA"), flip-chip, quad, or other package type. The parts are pre-marked with information such as the part type, place of manufacture, and serial number, which is traceable to a lot number. If parts are segregated after testing, they are typically marked to indicate their category. Some types are parts are not segregated into categories after testing, in other words, there is only one category type.

The output bench 100 has sliding rails 102, 104 that are laterally adjustable across a table top 106. The table top and other portions of the output bench 100 are sufficiently conductive and grounded to avoid electro-static discharge ("ESD") that could otherwise damage tested ICs. In a particular embodiment, the table top is made of an ESD laminate surface and carbon-based ESD paint is used to coat the sliding rails and other metal portions of the output bench 100.

The sliding rails 102, 104 slide in a first track 108 to segregate different categories of tested parts on the table top 106. The sliding rails 102, 104 are adjusted according to bin yields, for example, and can be moved during a test run while still maintaining product segregation. Tested parts are typically placed in ESD-safe trays, also known as chip carriers. The sliding rails provide a physical barrier against moving the chip trays between segregated areas 107, 109, 111 of the table top 106. Additional sliding rails are provided in alternative embodiments. In another embodiment, only a single sliding rail is provided.

Sliding tags 110, 112, 114 slide in a second track 116 and can be adjusted to match the segregated areas 107, 109, 111 of the table top 106 defined by the sliding rails 102, 104 and side panels 118, 120. The sliding tags have generic designations, such as "CAT 1" (category 1), or are labeled to provide more specific information about the product being segregated to the associated area of the table top 106.

Providing labels on the sliding tags avoids the need to attach labels to the tested parts or to the trays they are placed in. Other operators in the test area can determine which parts are in the trays within each segregated area according to the sliding tags and the sliding rails. A particular advantage is that, since the output bins are completely labeled and clearly segregated, operators can be changed without having to explain the status and layout of the output bench.

The output bench 100 also has a wire-mesh document box 122. The document box is sized to accept paper work associated with the run of ICs being tested, and in a particular embodiment is about 9×12×2 inches. For example, the document box 122 holds the paper work for the run of ICs in process. Fabricating the document box out of wire mesh allows other operators in the test area to see the status of a test station. Process documentation is moved from another (input) document box (see FIG. 2A, ref. num. 207) when testing of that lot of ICs begins. An empty input document box indicates that the test station is ready for another lot of ICs.

In a particular embodiment, the table top is higher than a standard desk or bench top, and is at a height such that a standing operator can process IC product without having to bend over, which is ergonomically desirable for ease of use. The table top 106 is sufficiently high to allow a trolley (cart) 130 to fit underneath. The trolley 130 is used to move tested product to another station, and also provides shelving 132, 134, 136 to store boxes 138, 140 of tested product. For example, chip carriers holding ICs that have been sorted according to an operating parameter are loaded into a box or tub having a label indicating the type (category) of IC it contains. The trolley 130 keeps the product boxes off of the work surface and segregates full trays from the table top 106.

Figure 1B:
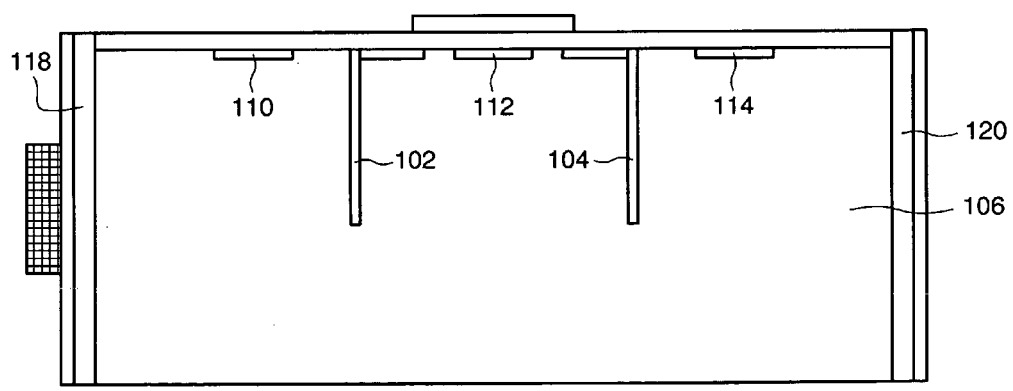
FIG. 1B is a top view of the output bench of FIG. 1A.

FIG. 1B is a top view of the output bench 100 of FIG. 1A. The sliding rails 102, 104 extend from the back wall 128 about ⅓ to ⅔ of the distance to the front of the table top 106; however, this distance is merely exemplary. The sliding rails are separately adjustable and may be moved to the right or left. Both of the sliding rails may be moved to the side panels 118, 120 to allow use of the entire table top 106, such as when processing parts that are not tested to separate bins. The sliding tags 110, 112, 114 are separately adjustable from each other and from the sliding rails 102, 104.

Figure 2A:
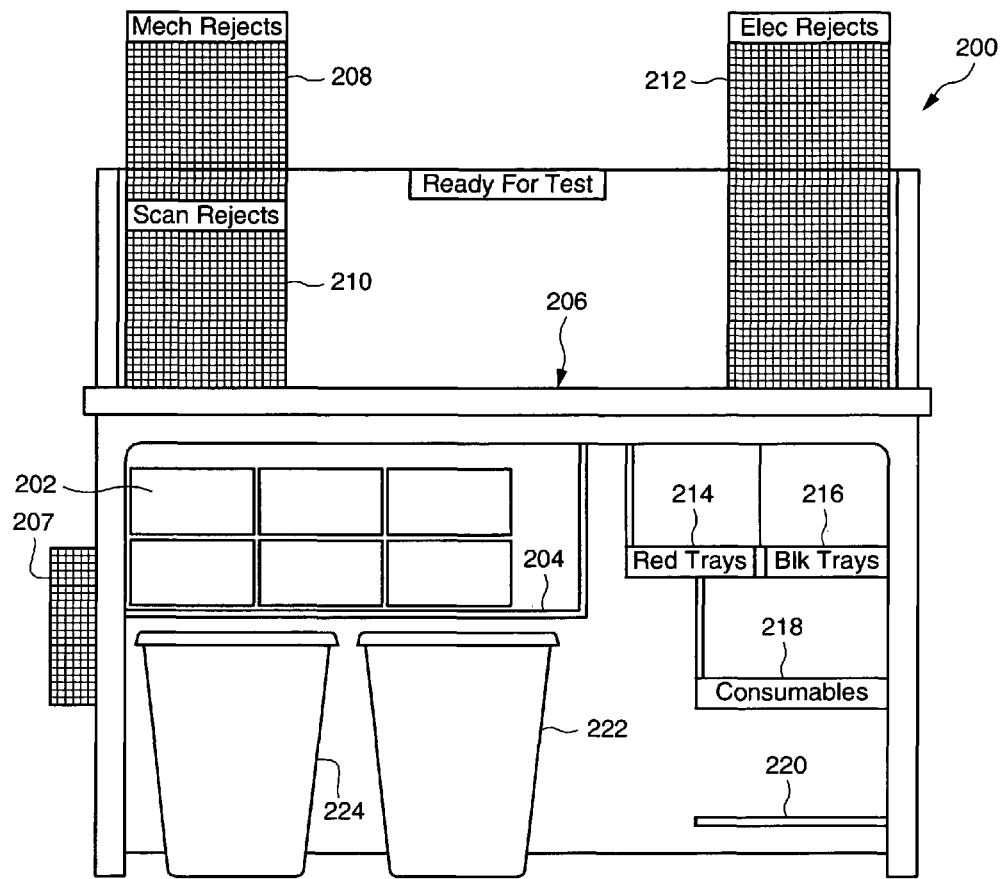
FIG. 2A is a front view of an input bench according to an embodiment of the invention.

FIG. 2A is a front view of an input bench 200 according to an embodiment of the invention. Product that is ready for testing is typically provided to the input bench in boxes 202. A box typically has five chip trays of ICs and a sixth empty chip tray that serves as a cover to the stack of trays. Boxes of the next lot of ICs to be tested are taken from a remote location, such as a shelf or a delivery trolley (not shown), and opened on the input bench 200. The trays of ICs to be tested are then stacked on a work top 206 and the empty boxes are stored on a shelf 204 below the work top 206. A document box 207 on the side of the input bench 200 receives the paper work (documentation) for the next lot of ICs to be tested.

ICs can fail for a variety of reasons. For example, an IC might fail for mechanical reasons, such as a crack or chip, or might fail electrical test, which means that the IC does not qualify for any of the bins on the output bench (see FIG. 1A, ref. num. 100), or might fail IR scanning, which identifies mechanical damage caused by the handler during electrical testing. The input bench 200 has a location to accumulate each type of possible failure. A first compartment 208 holds trays (not shown) of ICs rejected for mechanical failures. A second compartment 210 holds trays (not shown) of ICs that failed IR scan. A third compartment 212 holds trays (not shown) of ICs that failed electrical test.

Thus, the input bench 200 has a segregated location (i.e. separate compartments) for each type of failure. In a particular embodiment, the compartments are made of metal mesh so that an operator on the test floor can easily see how many of each type of rejected ICs have been accumulated at the input bench. Retaining rejects at the input bench avoids mixing rejects with binned (i.e. passed) product because binned product is segregated at the output bench (see FIG. 3, ref. num. 100) while rejected product is kept at the input bench (see FIG. 3, ref. num. 200).

The input bench 200 has additional shelves 214, 216, 218, 220 for storing supplies, such as extra (empty) trays, consumables, such as blank labels, pens, and tape, and a tool box. Providing shelving underneath the work top 206 allows storage of supplies and product without cluttering the working surface or obscuring the view above the input bench. The latter is desirable to maintain an open view of the test area, which facilitates visual inspection of the benches and determination of test activity (i.e. status) at the benches.

In a particular embodiment, the work top 206 is essentially the same height as the table top 106 of the output bench 100 of FIG. 1A. In other words, the work top 206 is at a sufficient height so as to allow a test operator to stand at the input bench and process product without bending over. This is ergonomically desirable and allows the test operator to move freely between the input bench, test system, and output bench (see FIG. 3). If a lower work top and/or table top is provided, the test operator typically has to bend over or to sit at a chair to process product. This involves having to sit and stand several times, and the chair takes up additional room on the test floor. A work top suitably high for standing at also provides room for the shelves 204, 214, 216, 218, 220, and optionally for trash bins 222, 224. In a particular embodiment, one trash bin is for recyclable material, and another is for trash.

Figure 2B:
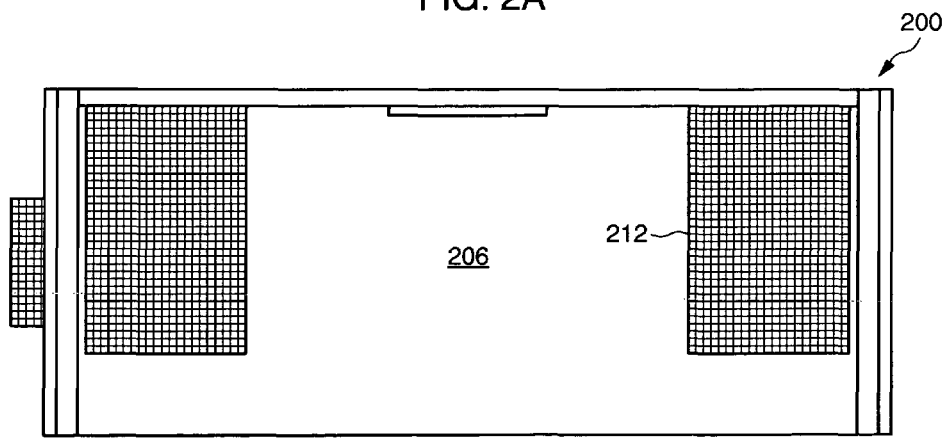
FIG. 2B is a top view of the input bench of FIG. 2A.

FIG. 2B is a top view of the input bench 200 of FIG. 2A. The third compartment sits on the work top 206 of the input bench. The work top 206 and other portions of the input bench 200 are sufficiently conductive and grounded to avoid ESD that could otherwise damage ICs. In a particular embodiment, the work top is made of an ESD laminate surface and carbon-based ESD paint is used to coat the metal portions of the input bench 200.

Figure 3:
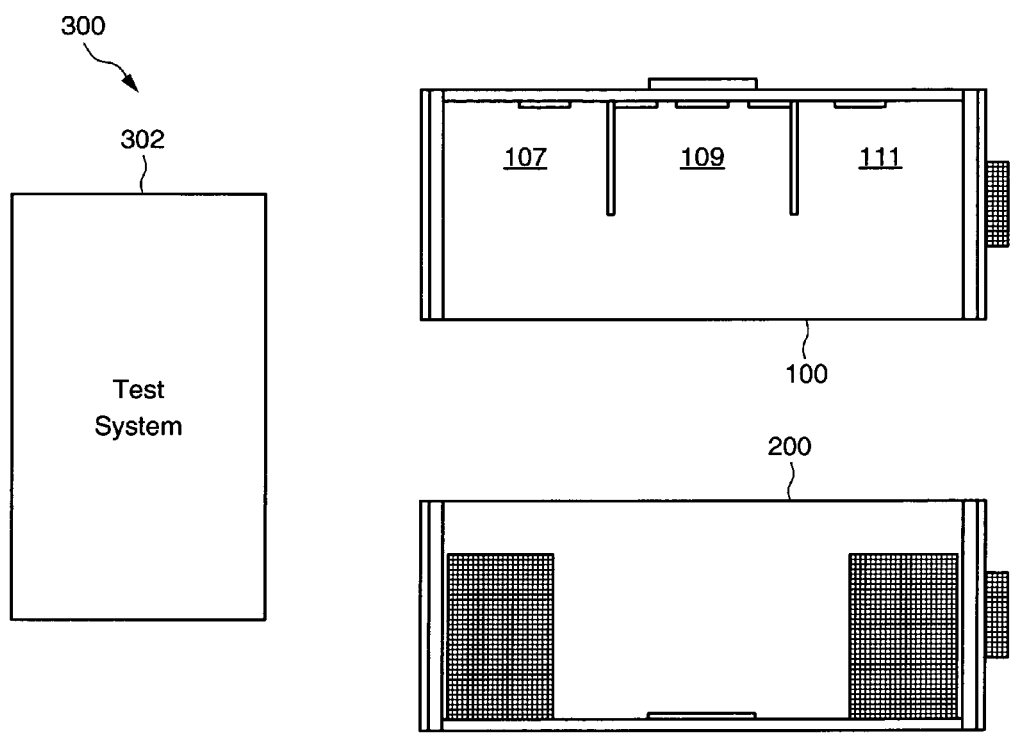
FIG. 3 is a top view of a test work station according to an embodiment of the invention.

FIG. 3 is a top view of an IC test work station 300 according to an embodiment of the invention. The IC test work station 300 includes an output bench 100, an input bench 200, and a test system 302. In a particular embodiment, the test system 302 includes both IR scan and electronic test. In other words, the test system performs a first type of test (electrical test) and a second type of test (IR scan). Alternatively the test system performs additional or alternative tests. In a particular embodiment, the test system performs a first type of electrical test (e.g. basic operational testing) and a second type of electrical test (e.g. parametric testing). Additionally, the test system can perform electrical tests at different operating conditions, such as at different temperatures. After testing, the product is marked according to performance at an elevated temperature.

In an exemplary test and sort sequence, a box of product trays (chip carriers) is opened at the input bench 200. The ICs are examined for mechanical defects, and failures are placed in a first segregated location on the input bench (see FIG. 2A, ref. num. 208). Chip carriers of ICs that pass visual inspection are placed in a handler (not separately shown) of the test system 302.

The handler is basically a robotic mechanism that sequentially loads ICs from a chip carrier into a test fixture of the test system, and when testing is completed, removes the IC from the text fixture and places the IC into the appropriate output chip carrier. In a particular embodiment, the test system has five different locations (bins) for tested parts. A first location is for accumulating electrical failures, a second location is for IR scan failures, and the three remaining locations are for parts that test to one of three categories.

The test system determines the appropriate bin for the tested IC. The handler automatically removes the IC from the test fixture and places it in a chip carrier in the appropriate bin. In a further embodiment, each of the output locations has a stack of empty chip carriers. When a chip carrier is full, or when the test lot is complete, the operator moves the chip carriers to their appropriate location on the input or output bench. For example, chip carriers of electrical failures are removed from the test system 302 and are placed in the electrical reject box 212 of the input bench 200, chip carriers of IR scan failures are placed in the IR scan reject box 210, chip carriers of ICs that pass electrical test and IR scan and test to a first category are placed in the first segregated area 107 of the output bench 100, and so forth.

Alternative embodiments have more or fewer tests, and hence more or fewer types of failure. For example, an alternative embodiment does not include a mechanical test (inspection) and/or IR scan. Similarly, an alternative embodiment has a number of electrical tests, for example a first electrical test for gross electrical performance, and a second electrical test for parametric characterization.

An example of a parametric value is an operating speed in the case of a field-programmable gate array ("FPGA") or other logic device. Other examples of parametric values that an IC might be sorted according to include power consumption and operating frequency range.

The IC test work station 300 is designed for the segregation of product, in particular, to avoid mixing of reject parts with good parts, and to avoid mixing of binned parts. In a particular embodiment, the input bench 200 and output bench 100 are designed to avoid ESD damage to the parts being tested.

Figure 4:
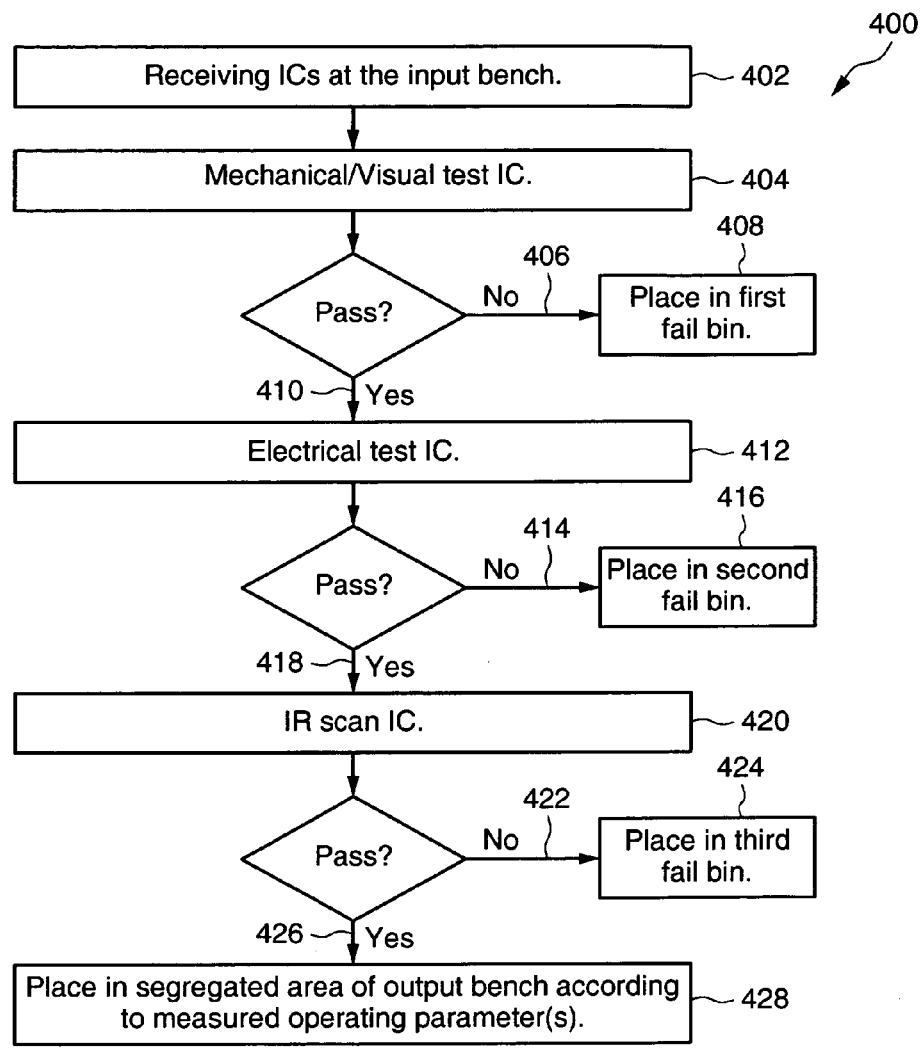
FIG. 4 is a flow chart of a method of segregating ICs according to an embodiment of the invention.

FIG. 4 is a flow chart of a method 400 of segregating ICs according to an embodiment of the invention. Product (ICs) is received at the input bench (step 402). An IC is examined for mechanical defects (step 404), and if it fails (branch 406), is placed in a first segregated location on the input bench (step 408). If the IC passes mechanical inspection (branch 410), it is electrically tested on the test system (step 412). ICs are usually tested as a lot. In a particular embodiment, a stack of chip carriers are loaded into the test system, and the robotic handler transfers the ICs from an input tray to the test fixture, and then from the test fixture to the appropriate output tray. The robotic handler continues loading and unloading ICs until the lot has been tested.

If the IC fails electrical test (branch 414) it is removed from the test system and placed in a second segregated location on the input bench (step 416). Typically, the IC is removed from the test system after the output tray it is in becomes full or when the lot has finished testing. If the IC passes electrical test (branch 418), it is IR scanned (step 420). If the IC fails IR scan (branch 422) it is removed from the test system and placed in a third segregated location on the input bench (step 424). If the IC passes IR scan (branch 426), the handler loads it into the appropriate output tray in the test system, and the IC is eventually placed in a segregated area of the output bench (step 426) according to a measured output parameter(s). Again, the IC is typically moved from the test system to the output bench when the output tray becomes full or the lot has finished testing. In a further embodiment, the location on the output bench is one of a plurality of segregated areas on the output bench, each of the plurality of segregated areas being associated with a category of tested ICs. In a particular embodiment, the ICs are FPGAs and the FPGAs are placed in the segregated areas according to their speed.

While the present invention has been described in connection with specific embodiments, variations of these embodiments will be obvious, or become obvious, to those of ordinary skill in the art. For example, parts may be binned to more or fewer categories, and a category may be defined by a combination of parametric test results, rather than a single test result. Therefore, the spirit and scope of the appended claims should not be limited to the foregoing description.

The invention claimed is:

1. An integrated circuit ("IC") test work station comprising:
    an output bench including
        a table top;
        a track mounted on, and parallel to, a rear edge of the table top; and
        a sliding rail dividing the table top into a first segregated area and a second segregated area, wherein a first end of the sliding rail is movably coupled to the track, wherein the sliding rail is movable along the track while maintaining an orientation that is parallel to a plane of the table top and perpendicular to the track, wherein the sliding rail has an unattached, second, distal end that extends at least one third of a distance from the rear edge to a front edge of the table top and less than two thirds of the distance, and wherein the sliding rail has a bottom edge configured to contact the table top forming a physical barrier between the first and the second segregated areas, preventing items from moving on the table top beneath the sliding rail_between the first and second segregated areas,
    wherein the output bench further includes
        a side panel; and
        a first document box mounted on the side panel,
            wherein the first document box is a first wire-mesh document box.

2. The IC test work station of claim 1 wherein the output bench further includes
    a first sliding tag associated with the first segregated area; and
    a second sliding tag associated with the second segregated area.

3. The IC test work station of claim 1 wherein the table top is at a height selected so that a push trolley fits directly beneath the table top.

4. The IC test station of claim 1 further comprising a trolley directly beneath the table top, wherein the trolley is a push trolley.

5. The IC test station of claim 4 wherein the trolley includes shelving adapted to store boxes of tested IC product beneath the table top.

6. The IC test station of claim 1 further comprising an input bench having
    a work top that is parallel to the plane of the table top;
    a shelf beneath the work top adapted to store boxes; and
    a plurality of compartments on the work top, each of the plurality of compartments being associated with each of a corresponding failure type.

7. The IC test station of claim 6 wherein the plurality of compartments includes a first compartment for accumulating mechanical reject IC product, a second compartment for accumulating infrared scan reject IC product, and a third compartment for accumulating electrical test reject IC product.

8. The IC test station of claim 6 further comprising a second wire-mesh document box.

9. The IC test station of claim 6 wherein the table top is at a height selected so that a push trolley fits directly beneath the table top, and the work top is essentially at the height of the table top.

10. The IC test station of claim 6 further comprising a test system.

11. The IC test station of claim 10 wherein the test system includes an infrared scan test and an electrical test.

12. A method of segregating integrated circuits ("ICs") comprising steps of:
    receiving ICs at an input bench;
    examining an IC received at the input bench for mechanical defects, and, if the IC fails, placing the IC in a first segregated location on the input bench;
    electrically testing the IC in a test system, and, if the IC fails, moving the IC from the test system to a second segregated location on the input bench, and, if the IC passes;
    measuring an operating parameter of the IC; and
    moving the IC from the test system to a first segregated area of a table top of an output bench according to the operating parameter of the IC, a sliding rail separating the first segregated area from a second segregated area,
    wherein the sliding rail divides the table top into the first segregated area and the second segregated area, wherein a first end of the sliding rail is movably coupled to a track mounted on, and parallel to, a rear edge of the table top, wherein the sliding rail is movable along the track while maintaining an orientation that is parallel to a plane of the table top and perpendicular to the track,
    wherein the sliding rail has an unattached, second, distal end that extends at least one third of a distance from a rear edge to a front edge of the table top and less than two thirds of the distance, and wherein the sliding rail has a bottom edge configured to contact the table top forming a physical barrier between the first and the second segregated areas, preventing items from moving on the table top beneath the sliding rail between the first and second segregated areas,
    wherein the output bench further includes
        a side panel; and
        a first document box mounted on the side panel,
            wherein the first document box is a first wire-mesh document box.

13. The method of claim 12 wherein the step of measuring the operating parameter occurs essentially concurrently with the step of electrically testing the IC.

14. The method of claim 12 wherein the test system determines a category of the IC according to the operating parameter, the IC being moved to the one of the first segregated area according to the category.

15. The method of claim 12 further comprising a step of performing an infrared scan of the IC, and, if the IC fails, placing the IC in a third segregated location on the input bench.

16. The method of claim 15 wherein the steps of examining, electrically testing, and performing an infrared scan are performed on a second IC, and further comprising steps of:
    measuring a second operating parameter of the second IC; and
    placing the second IC in the second segregated area of the output bench according to the second operating parameter.

17. The method of claim 12 wherein the IC is an FPGA and the operating parameter is a speed of the FPGA.

* * * * *